United States Patent
Kaiser

(10) Patent No.: US 9,864,277 B2
(45) Date of Patent: Jan. 9, 2018

(54) METHOD FOR REGULATING A LIGHT SOURCE OF A PHOTOLITHOGRAPHY EXPOSURE SYSTEM AND EXPOSURE ASSEMBLY FOR A PHOTOLITHOGRAPHY DEVICE

(71) Applicant: SUSS MicroTec Lithography GmbH, Garching (DE)

(72) Inventor: Paul Kaiser, Munich (DE)

(73) Assignee: SUSS Microtec Lithography GmbH (DE)

( * ) Notice: Subject to any disclaimer, the term of this patent is extended or adjusted under 35 U.S.C. 154(b) by 20 days.

(21) Appl. No.: 15/066,676

(22) Filed: Mar. 10, 2016

(65) Prior Publication Data
US 2016/0291480 A1 Oct. 6, 2016

(30) Foreign Application Priority Data
Apr. 1, 2015 (NL) .................................... 2014572

(51) Int. Cl.
| | |
|---|---|
| *G03B 27/32* | (2006.01) |
| *G03B 27/54* | (2006.01) |
| *G03B 27/72* | (2006.01) |
| *G03B 27/80* | (2006.01) |
| *G03F 7/20* | (2006.01) |

(52) U.S. Cl.
CPC ........ *G03F 7/70191* (2013.01); *G03F 7/7005* (2013.01); *G03F 7/70075* (2013.01); *G03F 7/70391* (2013.01); *G03F 7/70575* (2013.01)

(58) Field of Classification Search
CPC .............. G03F 7/70008; G03F 7/7005; G03F 7/70075; G03F 7/70191; G03F 7/70391; G03F 7/7055; G03F 7/70575
USPC ................................. 355/67–70, 77; 362/612
See application file for complete search history.

(56) References Cited

U.S. PATENT DOCUMENTS

| | | | | |
|---|---|---|---|---|
| 2008/0111983 | A1* | 5/2008 | Singer | G03F 7/70066 355/69 |
| 2009/0257038 | A1 | 10/2009 | Yamamoto | |
| 2010/0283978 | A1* | 11/2010 | Hawryluk | G03F 7/70075 355/18 |

* cited by examiner

*Primary Examiner* — Colin Kreutzer
(74) *Attorney, Agent, or Firm* — Hayes Soloway PC

(57) ABSTRACT

The invention relates to a method for regulating a light source of a photolithography exposure system which comprises a plurality of LEDs, by means of the following steps: the light output of the individual LEDs in specific wavelength ranges is detected, and the detected light output is compared with a desired light output distribution over the entire spectrum. The LEDs are operated such that the desired spectral light output distribution is achieved in the most precise manner possible. The invention also relates to an exposure assembly for a photolithography device, having a light source which comprises a plurality of LEDs, a control means which controls the electrical power supplied to the individual LEDs, and a sensor which can detect the light output of the LEDs in the respective ranges of the wavelengths.

19 Claims, 1 Drawing Sheet

METHOD FOR REGULATING A LIGHT SOURCE OF A PHOTOLITHOGRAPHY EXPOSURE SYSTEM AND EXPOSURE ASSEMBLY FOR A PHOTOLITHOGRAPHY DEVICE

The invention relates to a method for regulating a light source of a photolithography exposure system and to an exposure assembly for a photolithography device.

BACKGROUND OF THE INVENTION

A photolithography device is used in the production of three-dimensional structures on semiconductor chips. It is used to expose a photoresist (also called "resist") applied to a semiconductor chip ("wafer") to light in a desired manner. Thus the image of a mask is projected onto the photoresist which is exposed to light differently by reason of the casting of a shadow. The exposure causes the photoresist to change its physical and/or chemical properties so it can subsequently be removed e.g. in a selective manner.

The light used to expose the photoresist is provided by a light source which comprises a plurality of LEDs. Thus different LEDs can be used which provide light with different specific wavelengths (or wavelength ranges).

However, it has proved to be the case that the LEDs age differently depending on the wavelength of the light they provide. The result of this is that the distribution of the light output provided by the light source over the spectrum changes over time. Therefore, the exposure result in the photoresist changes depending on the age of the LED light source, i.e. with the age of the exposure assembly.

It is the object of the invention to ensure that the spectrum of the exposure assembly, i.e. the intensity distribution of the different wavelengths of the exposure assembly, is kept constant over time.

BRIEF DESCRIPTION OF THE INVENTION

In order to achieve this object a method is provided in accordance with the invention for regulating a light source of a photolithography exposure system which comprises a plurality of LEDs, wherein the following steps are provided: the light output of the individual LEDs in specific wavelength ranges is detected. The detected light output is compared with a desired light output distribution over the entire spectrum. The LEDs are operated such that the desired spectral light output distribution is achieved in the most precise manner possible. In order to achieve this object, an exposure assembly for a photolithography device is also provided, having a light source which comprises a plurality of LEDs, a control means which controls the electrical power supplied to the individual LEDs, and a light sensor which can detect the light output of the LEDs in the respective ranges of the wavelengths. The invention is based on the basic idea of detecting a possible decrease in output of the LED (or LEDs) which provide(s) light of a specific wavelength (or of a specific wavelength range), and to regulate the LEDs as a whole such that the portion of the overall light output which is provided by the different LEDs corresponds to a preset ratio as good as possible.

Provision is preferably made for the light output of more powerful LEDs to be adapted to the light output of the weakest LED. Expressed simply, the weakest LED is used as a reference, and the stronger LEDs are dimmed in terms of their light output such that the light output provided as a whole corresponds as precisely as possible to the desired distribution with respect to the distribution of the output at the different wavelengths or wavelength ranges.

In accordance with one embodiment of the invention provision is made for the light output to be measured by means of a spectrally selective sensor. "Spectrally selective" means that the sensor outputs a signal which assigns a measured light output to a specific part of the spectrum, i.e. to a wavelength or wavelength range. Thus in practice the spectrally selective sensor can be formed from a plurality of sub-sensors which are each allocated to a specific wavelength or a specific wavelength range.

In accordance with an alternative embodiment of the invention provision is made for the LEDs to be switched on one after another and for the light output to be measured by means of a broadband sensor. The broadband sensor is distinguished from a spectrally selective sensor by lower costs. However, the broadband sensor is not able to allocate the measured light output to individual wavelengths or wavelength ranges. This is compensated for by the fact that the LEDs are switched on one after the other. Therefore, in dependence upon the LED which is either switched on first or is then added in, the control means can recognise which light output originates from the corresponding LED. After a corresponding comparison, the broadband sensor can also be used to determine the exposure intensity, this being achievable with a spectrometer only in a very laborious manner.

In accordance with one embodiment of the invention provision is made for the sensor to be integrated into the light source. This makes it possible to detect the light output during operation of the photolithography device, in particular during an exposure process.

It is also possible for the sensor to be disposed on a lens of the photolithography device. If the light is detected e.g. in front of the front lens or even in the integrator, the light already mixed by the exposure lens is detected, i.e. the light which falls on the wafer. The result of this detection is thus more representative.

In order to prevent the measurement impairing the exposure of the wafer, provision can be made for the light output of the exposure device to be measured in a calibration step, e.g. directly in the exposure plane. For this purpose, e.g. a movable sensor can be used which is temporarily introduced in the light path. The sensor can be a calibrated one.

In accordance with one embodiment of the invention provision is made for the heating characteristic of the individual LEDs to be measured. For this purpose, the control means is preferably provided with a memory for storing a heating characteristic of the LEDs. This makes it possible to compensate for the non-linear progression of the light output when the LEDs are operated at constant power. It is also possible to operate the LEDs with regulated power. In this way, when a spectrally selective sensor is used, the power can be regulated "in real time" such that the individual LEDs provide the light output desired for each wavelength or each wavelength range. If a broadband sensor is used, the power of the individual LEDs can be regulated corresponding to the stored switch-on characteristics, such that the most constant light output possible is achieved for the individual wavelengths or wavelength ranges.

In accordance with one embodiment of the invention provision is made that the ageing of the LEDs is compared with stored typical ageing characteristics. For this purpose, provision is preferably made for the control means to have a memory for storing ageing characteristics of the LEDs. This makes it possible for a user to be informed early if the light output of the LEDs reaches a critical value. For example, with the aid of the usual ageing characteristics, a user can be informed at what time an exchange of the light source (or individual LEDs of the light source) is likely to be necessary.

Provision can also be made for the light output of the LEDs to be compared with a preset minimum light output. In this case it is also possible to inform a user when the light output of the LEDs reaches a critical value and so the light source (or individual LEDs of the light source) can be changed before the operation of the photolithography device is impaired.

BRIEF DESCRIPTION OF THE DRAWINGS

The invention will be described hereinafter with the aid of two embodiments which are illustrated in the attached drawings in which.

DETAILED DESCRIPTION OF THE INVENTION

Figure 1:
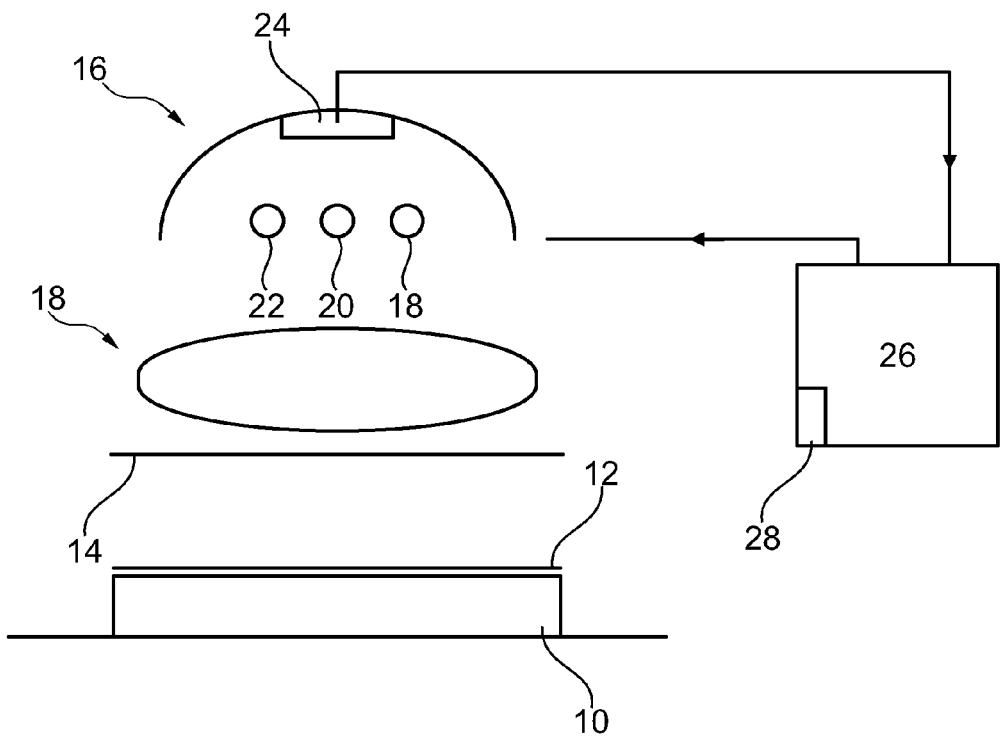
FIG. 1 schematically shows a photolithography device in accordance with a first embodiment.

FIG. 1 shows a substrate 10 ("wafer") which is coated with a photoresist 12 (also called "resist"). The substrate can consist of a semiconductor material.

The photoresist 12 is to be exposed to light through a mask 14. The light issues from a light source 16 shown schematically herein, from which it falls onto the wafer 10 via a lens 18 likewise shown schematically.

The light source 16 comprises a plurality of LEDs 18, 20, 22 which are each assigned to a wavelength or wavelength range. For example, the LEDs 18, 20, 22 can each provide light which corresponds to one of the three Hg-wavelengths of the conventional mercury-vapour lamps. The LEDs 18, 20, 22 are generally UV-LEDs.

In so far as an LED is stated herein to be assigned to a wavelength or a wavelength range, this "one" LED can in practice consist of a plurality of LEDs. Thus a plurality of LEDs 18 can be provided which provide light in a first wavelength or a first wavelength range, and a plurality of LEDs 20 which provide light in a second wavelength or a second wavelength range, and a plurality of LEDs 22 which provide light in a third wavelength or a third wavelength range. In a deviation from the illustrated embodiment it is also possible for the light source 16 to comprise only two LEDs (or groups of LEDs) which provide light in a first wavelength and a second wavelength (or a first wavelength range and a second wavelength range), but also more than three LEDs or groups of LEDs with correspondingly more than three wavelengths or wavelength ranges.

The light source 16 is assigned a sensor 24 which can detect the light output provided. The illustrated exemplified embodiment is a spectrally selective sensor, with which the light output of the individual wavelengths or wavelength ranges of the LEDs 18, 20, 22 can be directly detected.

The sensor 24 is connected to a control means 26 (e.g., a controller) and so the information relating to the light output for the individual wavelengths or wavelength ranges is available to the control means. The control means 26 in turn activates the individual LEDs 18, 20, 22 and thus provides in particular the operating voltage and the operating current.

A desired light output distribution for the light provided by the light source 16 is stored in the control means 26. Expressed simply, the control means 26 stores which portion of the light output is to be provided in which range of the spectrum. As an example it is assumed hereunder that the overall light output provided by the light source 16 is to be provided in a proportion of one third in the spectrum of the LED 18, one third in the spectrum of the LED 20 and one third in the spectrum of the LED 22.

When the light source 16 is being operated, the control means can detect via the sensor 24 which light output is actually provided in the three wavelengths or wavelength ranges. The control means 26 can regulate the electrical power of the LEDs 18, 20, 22 such that the desired light output distribution is achieved.

When, by reason of ageing or other changes, an LED no longer achieves the desired light output, this is detected by the control means 26. The control means 26 can then correspondingly regulate the electrical power supplied to the remaining LEDs and so the desired distribution of the light output (but then at a lower intensity level) is achieved. When, e.g. the LED 18 can supply only 90% of the light output in its wavelength or its wavelength range, the LEDs 20, 22 can be dimmed such that the overall light output over the spectrum originates again at a proportion of one third from LED 18, one third from LED 20 and one third from LED 22.

In one embodiment variation, the sensor 24 is not a spectrally selective sensor but a broadband sensor. This sensor merely provides information over the light output provided as a whole; it is not able to assign this information to different wavelengths.

In order also to obtain information from such a sensor as to how the light output is distributed over the whole spectrum, the control means 26 switches the individual LEDs 18, 20, 22 on one after another. In this way the light output provided for each wavelength or each wavelength range can be measured as the difference between the light output in the previous state and the light output in the current state.

With the sensor 24 it is also possible to measure the heating characteristic of the individual LEDs and to store it in a memory 28 which is provided in the control means 26 to store the heating characteristic. In this way it is possible e.g. in a separate calibration step to detect the heating characteristic of each LED individually over a longer period of time until a constant light output is set. If then, later in operation, the individual light outputs are to be detected, the LEDs 18, 20, 22 can be switched on comparatively shortly one after another, namely in each case when the previous LED has passed through a part of its heating curve which is characteristic in so far as it is possible to draw a conclusion therefrom as to the light output provided later.

It is also possible in this embodiment to operate the LEDs 18, 20, 22 in each case with a constant power which has been suitably adapted under consideration of the heating characteristic in order to achieve the desired light output distribution in the most precise manner possible.

Figure 2:
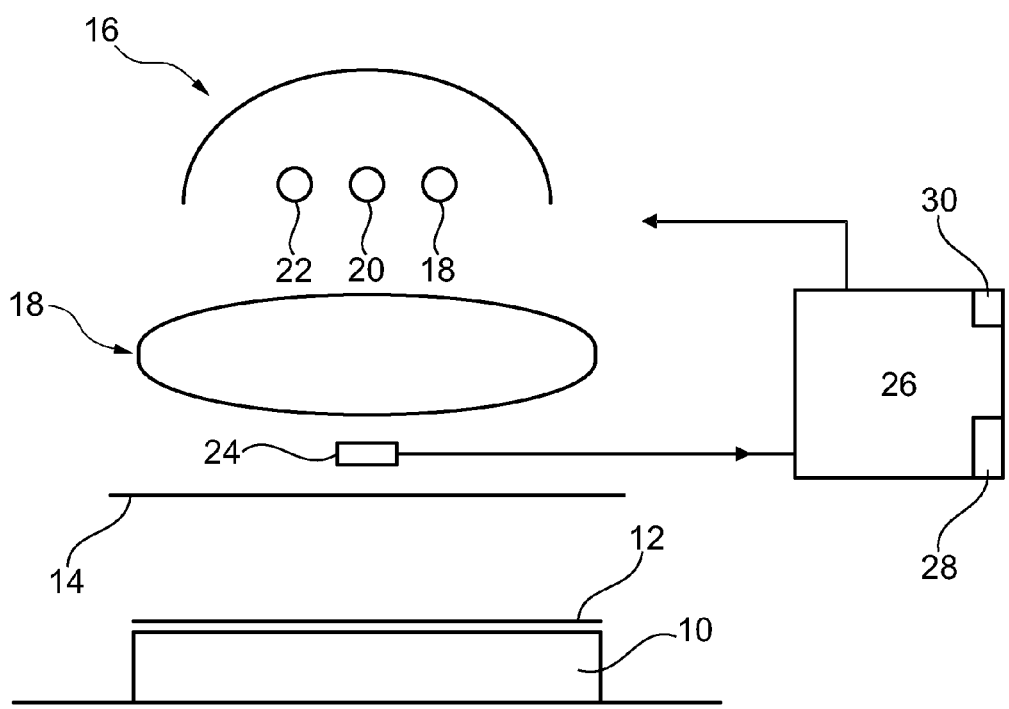
FIG. 2 schematically shows a photolithography device in accordance with a second embodiment.

FIG. 2 shows a second embodiment. For the components known from the first embodiment the same reference signs are used and reference is made in this respect to the explanations given above.

The difference between the first and the second embodiment is that in the second embodiment the sensor 24 is not assigned to the light source 18 but is disposed behind the lens 18. This means that the sensor 24 detects the mixed light, i.e. the light which falls on the wafer 10. The information about the distribution of the light output of the LEDs 18, 20, 22 is thus more precise since all the influences in the region of the light path to the sensor 24 are considered.

The sensor 24 is either disposed at a suitable location at which it does not disrupt the exposure of the photoresist 12. In this case, measuring can be carried out during exposure.

Alternatively, it is possible for the sensor 24 to be movable and to be brought into the light path for the purpose of calibration (i.e. outside an exposure process). Alternatively, it is possible for this purpose also to use a sensor calibrated according to a recognised standard in order, in addition to the spectral distribution, also to determine the absolute intensities of the individual light sources or the sum of different light sources. After the light output distribution has been determined, the LEDs 18, 20, 22 can be operated with suitable output in one or a plurality of subsequent exposure processes. A new calibration process can then be triggered if the control means 26 deems this to be expedient. At this juncture, it is possible to refer to the ageing characteristic of the LEDs, which can be stored in a memory 30 of the control means 26.

The invention claimed is:

1. A method for regulating a light source of a photolithography exposure system which comprises a plurality of light-emitting diodes (LEDs) providing light at different wavelengths or different wavelength ranges, the method comprising the following steps:
   A light output of individual ones of said LEDs is being detected in specific wavelength ranges corresponding to said wavelengths or wavelength ranges of said one of said LEDs;
   said detected light output at said specific wavelengths or in said specific wavelength ranges is compared with a desired light output distribution comprising all of said different wavelengths or wavelength ranges over an entire spectrum of said desired light output distribution; and
   said LEDs are being operated such that said desired spectral light output distribution is achieved in the most precise manner possible.

2. The method of claim 1 wherein a light output of more powerful ones of said LEDs is adapted to a light output of a weakest one of said LEDs.

3. The method of claim 1 wherein said light output is measured by means of a spectrally selective sensor.

4. The method of claim 1 wherein said LEDs are switched on one after another, said light output being measured by means of a broadband sensor.

5. The method of claim 1 wherein said light output of said LEDs is measured in a calibration step.

6. The method of claim 1 wherein a heating characteristic of individual ones of said LEDs is being measured.

7. The method of claim 1 wherein said LEDs are operated with a constant power.

8. The method of claim 1 wherein said LEDs are operated with a regulated power.

9. The method of claim 1 wherein an ageing of said LEDs is compared with stored typical ageing characteristics.

10. The method of claim 1 wherein said light output of said LEDs is compared with a preset minimum light output.

11. The method of claim 9 wherein a user is informed when said light output of said LEDs reaches a critical value.

12. An exposure assembly for a photolithography device, having:
    a light source which comprises a plurality of light-emitting diodes (LEDs) configured to provide light at different wavelengths or different wavelength ranges;
    a controller which controls the electrical power supplied to individual ones of said LEDs; and
    a sensor which can detect a light output of individual ones of said LEDs in respective wavelength ranges corresponding to said wavelengths or wavelength ranges of said LEDs;
    wherein:
        said detected light output at said wavelengths or in said wavelength ranges is compared with a desired light output distribution comprising all of said different wavelengths or wavelength ranges over an entire spectrum of said desired light output distribution; and
        said LEDs are configured to be operated such that said desired spectral light output distribution is achieved in the most precise manner possible.

13. The exposure assembly of claim 12 wherein said sensor is a spectrally selective sensor.

14. The exposure assembly of claim 12 wherein said sensor is a broadband sensor.

15. The exposure assembly of claim 12 wherein said sensor is integrated into said light source.

16. The exposure assembly of claim 12 wherein said sensor is disposed on a lens of a photolithography device.

17. The exposure assembly of claim 12 wherein said controller comprises a memory for storing a heating characteristic of said LEDs.

18. The exposure assembly of claim 12 wherein said controller comprises a memory for storing an ageing characteristic of said LEDs, into which an ageing characteristic of said LEDs is being written.

19. A method for regulating a light source of a photolithography exposure system which comprises a plurality of light-emitting diodes (LEDs) providing light at different wavelengths or different wavelength ranges, the method comprising the following steps:
    A light output of individual ones of said LEDs is being detected in specific wavelength ranges corresponding to said wavelengths or wavelength ranges of said one of said LEDs;
    said detected light output at said specific wavelengths or in said specific wavelength ranges is compared with a desired light output distribution comprising all of said different wavelengths or wavelength ranges over an entire spectrum of said desired light output distribution; and
    said LEDs are being operated such that said desired spectral light output distribution is achieved in the most precise manner possible, wherein a light output of more powerful ones of said LEDs providing light at one of said different wavelengths or different wavelength ranges is adapted to a light output of a weakest one of said LEDs providing light in a different one of said different wavelengths or different wavelength ranges.

* * * * *